(12) United States Patent
Akram et al.

(10) Patent No.: US 7,093,358 B2
(45) Date of Patent: *Aug. 22, 2006

(54) METHOD FOR FABRICATING AN INTERPOSER

(75) Inventors: Salman Akram, Boise, ID (US); Alan G. Wood, Boise, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 243 days.

This patent is subject to a terminal disclaimer.

(21) Appl. No.: 10/648,163

(22) Filed: Aug. 26, 2003

(65) Prior Publication Data

US 2004/0034996 A1 Feb. 26, 2004

Related U.S. Application Data

(60) Continuation of application No. 09/843,119, filed on Apr. 26, 2001, now Pat. No. 6,634,100, which is a division of application No. 09/533,407, filed on Mar. 23, 2000, now Pat. No. 6,529,027.

(51) Int. Cl.
H01R 43/16 (2006.01)

(52) U.S. Cl. ............... 29/874; 29/882; 29/884; 29/852; 29/830; 324/758; 438/106

(58) Field of Classification Search .......... 29/830–835, 29/882, 874, 852, 846, 847; 174/255, 260, 174/262, 264; 257/680, 90; 438/106–112, 438/25, 64; 324/775–758
See application file for complete search history.

(56) References Cited

U.S. PATENT DOCUMENTS

| 3,777,221 | A | 12/1973 | Tatusko et al. |
| 4,371,912 | A | 2/1983 | Guzik |
| 4,466,184 | A | 8/1984 | Cuneo et al. |
| 4,512,509 | A | 4/1985 | Ellis, Jr. et al. |
| 4,810,868 | A | 3/1989 | Drexler |
| 5,012,187 | A | 4/1991 | Littlebury |
| 5,014,161 | A | 5/1991 | Lee et al. |
| 5,014,418 | A | 5/1991 | Wright |
| 5,085,362 | A | 2/1992 | Art et al. |
| 5,173,220 | A | 12/1992 | Reiff et al. |

(Continued)

OTHER PUBLICATIONS

Miller et al., "Maskless Mesoscale Materials Deposition", Deposition Technology, Sep. 2001, pp. 20-22.

(Continued)

Primary Examiner—Minh Trinh
(74) Attorney, Agent, or Firm—TraskBritt

(57) ABSTRACT

An interposer including a fence that receives and aligns a semiconductor device, such as a flip-chip type semiconductor device, with an interposer substrate. The fence may include edges that are configured to progressively align a semiconductor device with the interposer substrate. The fence may also include one or more laterally recessed regions to facilitate rough alignment of a semiconductor device with the interposer substrate. Methods for fabricating the fence include the use of stereolithographic and molding processes. When stereolithography is used to fabricate the fence, a machine vision system that includes at least one camera operably associated with a computer may be used to control a stereolithography apparatus and facilitates recognition of the position and orientation of interposer substrates on and around which material is to be applied in one or more layers to form the fence. As a result, the interposer substrates need not be precisely mechanically aligned.

29 Claims, 9 Drawing Sheets

U.S. PATENT DOCUMENTS

| | | | |
|---|---|---|---|
| 5,264,061 A | 11/1993 | Juskey et al. | |
| 5,278,442 A | 1/1994 | Prinz et al. | |
| 5,282,312 A | 2/1994 | DiStefano et al. | |
| 5,290,193 A | 3/1994 | Goff et al. | |
| 5,475,317 A | 12/1995 | Smith | |
| 5,484,314 A | 1/1996 | Farnworth | |
| 5,500,605 A | 3/1996 | Chang | |
| 5,559,444 A | 9/1996 | Farnworth et al. | |
| 5,561,328 A | 10/1996 | Massingill et al. | |
| 5,572,140 A | 11/1996 | Lim et al. | |
| 5,625,298 A | 4/1997 | Hirano et al. | |
| 5,633,122 A | 5/1997 | Tuttle | |
| 5,634,267 A | 6/1997 | Farnworth et al. | |
| 5,646,447 A | 7/1997 | Ramsey et al. | |
| 5,659,952 A | 8/1997 | Kovac et al. | |
| 5,705,117 A | 1/1998 | O'Connor et al. | |
| 5,736,279 A | 4/1998 | Mott et al. | |
| 5,744,084 A | 4/1998 | Chia et al. | |
| 5,773,320 A | 6/1998 | Bayerer | |
| 5,802,699 A | 9/1998 | Fjelstad et al. | |
| 5,807,104 A | 9/1998 | Ikeya et al. | |
| 5,815,000 A | 9/1998 | Farnworth et al. | |
| 5,915,977 A | 6/1999 | Hembree et al. | |
| 6,002,266 A | 12/1999 | Briggs et al. | |
| 6,016,060 A | 1/2000 | Akram et al. | |
| 6,018,249 A | 1/2000 | Akram et al. | |
| 6,114,090 A | 9/2000 | Wu et al. | |
| 6,205,660 B1 | 3/2001 | Fjelstad et al. | |
| 6,242,932 B1 | 6/2001 | Hembree | |
| 6,251,488 B1 | 6/2001 | Miller et al. | |
| 6,259,962 B1 | 7/2001 | Gothait | |
| 6,268,584 B1 | 7/2001 | Keicher et al. | |
| 6,297,654 B1 | 10/2001 | Barabi | |
| 6,391,251 B1 | 5/2002 | Keicher et al. | |
| 6,400,174 B1 | 6/2002 | Akram et al. | |
| 6,468,891 B1 | 10/2002 | Williams | |
| 6,500,746 B1 | 12/2002 | Williams | |
| 6,524,346 B1 | 2/2003 | Farnworth | |
| 6,529,027 B1 * | 3/2003 | Akram et al. | 324/758 |
| 6,531,335 B1 | 3/2003 | Grigg | |
| 6,537,842 B1 | 3/2003 | Akram | |
| 6,611,053 B1 | 8/2003 | Akram | |
| 6,630,730 B1 | 10/2003 | Grigg | |
| 6,632,732 B1 | 10/2003 | Williams | |
| 6,634,100 B1 * | 10/2003 | Akram et al. | 29/874 |
| 2001/0035597 A1 | 11/2001 | Grigg et al. | |
| 2001/0051395 A1 | 12/2001 | Grigg et al. | |
| 2002/0102829 A1 | 8/2002 | Williams | |
| 2002/0111003 A1 | 8/2002 | Williams | |
| 2002/0171177 A1 | 11/2002 | Kritchman et al. | |
| 2003/0045047 A1 | 3/2003 | Williams | |
| 2003/0068840 A1 | 4/2003 | Grigg | |
| 2003/0098470 A1 | 5/2003 | Williams | |
| 2003/0102566 A1 | 6/2003 | Farnworth | |
| 2003/0111727 A1 | 6/2003 | Kurusu | |
| 2003/0151167 A1 | 8/2003 | Kritchman et al. | |
| 2003/0180974 A1 | 9/2003 | Akram | |
| 2003/0181003 A1 | 9/2003 | Akram | |
| 2003/0186496 A1 | 10/2003 | Akram | |

OTHER PUBLICATIONS

Miller, "New Laser-Directed Deposition Technology", Microelectronic Fabrication, Aug. 2001, p. 16.

Webpage, Objet Prototyping the Future, Objet FullCure700 Series, 1 page.

Webpage, Objet Prototyping the Future, How it Works, 2 pages.

U.S. Appl. No. 09/511,986, filed Feb. 24, 2000, "Stereolithographically Fabricated Conductive Elements, Semiconductor Device Components and Assemblies Including Such Conductive Elements, and Methods", inventor Vernon M. Williams.

U.S. Appl. No. 10/619,963, filed Jul. 15, 2003, "Stereolithographic Methods for Securing Conductive Elements to Contacts of Semiconductor Device Components", inventor Vernon M. Williams.

U.S. Appl. No. 10/641,471, filed Aug. 14, 2003, "Protective Structures for Bond Wires", inventor Salman Akram.

* cited by examiner

METHOD FOR FABRICATING AN INTERPOSER

CROSS-REFERENCE TO RELATED APPLICATIONS

This application is a continuation of application Ser. No. 09/843,119, filed Apr. 26, 2001, now U.S. Pat. No. 6,634,100, issued Oct. 21, 2003, which is a divisional of application Ser. No. 09/533,407, filed Mar. 23, 2000, now U.S. Pat. No. 6,529,027, issued Mar. 4, 2003.

BACKGROUND OF THE INVENTION

1. Field of the Invention

The present invention relates generally to an interposer configured to receive a semiconductor device for testing. More specifically, the invention pertains to such a test interposer having an alignment fence for receiving and aligning semiconductor devices, such as flip-chip type semiconductor dice, ball grid array (BGA) packages, and chip scale packages (CSPs), with test sockets of the interposer. The present invention also relates to methods for fabricating such a test interposer.

2. Background of Related Art

The semiconductor industry produces extremely large numbers of miniature electrical devices, or "chips" or dice, which are referred to as semiconductor devices. Semiconductor devices are installed in essentially every electronic device. Such devices are typically fabricated in large numbers on a wafer of semiconductive material (e.g., silicon, gallium arsenide, or indium phosphide). The individual chips or dice are then singulated from the wafer.

Tests are typically performed at several stages of manufacture for the purposes of evaluating the electrical characteristics of various circuits of the semiconductor devices and for detecting electrical, structural, and other types of faults in the semiconductor devices. These tests are sometimes performed on representative semiconductor devices and sometimes on each semiconductor device of a certain type, depending on the criticality of use, manufacturing costs, and expectation of flaws.

Conventionally, the semiconductor industry favored a "final" electrical testing of semiconductor devices, which was effected before semiconductor devices were packaged with electrical leads extending therefrom and encapsulated in a protective material. However, it is now recognized that conventional packaging processes may cause significant numbers of semiconductor devices to fail. For example, as a semiconductor device is being encapsulated, the protective material may cause particulate die coat penetration, "bond wire sweep," which may break electrical connections made by the bond wires or cause electrical shorts between adjacent bond wires, and other problems. Accordingly, it is desirable to test semiconductor devices after they have been packaged.

Some state of the art semiconductor devices lack conventional packages (e.g., leads and encapsulants) or are minimally packaged. Flip-chip type semiconductor devices may be left unpackaged and connected directly to a higher level substrate by way of conductive structures, such as solder balls, disposed between the bond pads of the flip-chip and corresponding contact pads of the higher level substrate.

Ball grid array packages, a type of flip-chip semiconductor device, may include a semiconductor die disposed on and electrically connected to an interposer. The interposer has contact pads on the opposite side thereof that are arranged in a pattern complementary to that of contact pads on a higher level substrate to which the ball grid array package is to be connected. The interposer may also include electrical traces that lead to contact pads arranged in a different pattern than the bond pads of the semiconductor die and, therefore, reroute the bond pads of the semiconductor die.

Another type of state of the art package is the so-called "chip scale package," wherein the dimensions of the total package are only slightly larger than the dimensions of the semiconductor die thereof. A chip scale package typically includes a flip-chip type semiconductor die with one or more thin layers of protective material (e.g., plastic encapsulant) on the active surface thereof. Conductive structures (e.g., solder bumps) protrude from bond pads of the flip-chip type semiconductor die and extend above the layer of protective material. Chip scale packages may also have one or more thin layers of protective material on the edges or backsides of the semiconductor dice thereof. Ball grid array packages may be formed as chip scale packages.

When these types of semiconductor devices are tested, the solder bumps or other conductive structures protruding therefrom may not properly align with the corresponding test sockets of a test substrate so as to establish adequate electrical contacts between the tested semiconductor device and the test substrate. Moreover, if misalignment occurs, the conductive structures may be damaged.

In order to reduce potential damage to conductive structures, such as solder bumps, during the testing of flip-chip type semiconductor devices, interposers have been used between a test substrate and a semiconductor device to be tested. These interposers may comprise micromachined silicon or ceramic structures that include metal-lined recesses for receiving conductive structures of a semiconductor device to be tested, metal-filled vias extending from the bottom of each recess to the opposite, bottom side of the interposer, and conductive structures, such as solder bumps, communicating with the metal-filled vias and protruding from the bottom side of the interposer. The recesses of the interposer are configured to receive the conductive structures of a semiconductor device to be tested without stressing or damaging the conductive structures. The metal lining of and metal-filled via communicating with each recess facilitates electrical communication between a conductive structure disposed in each recess and the corresponding, underlying conductive structure protruding from the bottom of the interposer. The conductive structures of the interposer are precisely aligned with test pads or sockets of a test substrate so as to establish an electrical connection between a semiconductor device assembled with the interposer and the test substrate. The test pads or sockets of the test substrate communicate with known semiconductor device test equipment.

Nonetheless, the conductive structures protruding from a semiconductor device to be tested may be damaged when assembled with such an interposer. Moreover, since the recesses of such interposers are configured to receive the conductive structures of a semiconductor device without stressing, deforming, or otherwise damaging the conductive structures, the interposer may fail to make adequate electrical connections between some of the conductive structures and their corresponding test pads or sockets of the test substrate. Moreover, test interposers typically lack any alignment component other than the recesses thereof.

Accordingly, it appears that the art is lacking a structure for aligning the conductive structures of a semiconductor device with corresponding test pads or sockets of a test substrate without stressing or damaging the conductive structures while facilitating adequate electrical connections between the conductive structures and the test pads or sockets.

In the past decade, a manufacturing technique termed "stereolithography," also known as "layered manufacturing," has evolved to a degree where it is employed in many industries.

Essentially, stereolithography as conventionally practiced involves the use of a computer to generate a three-dimensional (3-D) mathematical simulation or model of an object to be fabricated, such generation usually effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and nonmetallic materials. Regardless of the material employed to fabricate an object, stereolithographic techniques usually involve disposition of a layer of unconsolidated or unfixed material corresponding to each layer within the object boundaries, followed by selective consolidation or fixation of the material to at least a semisolid state in those areas of a given layer corresponding to portions of the object, the at least partially consolidated or fixed material also at that time being substantially concurrently bonded to a lower layer. The unconsolidated material employed to build an object may be supplied in particulate or liquid form, and the material itself may be consolidated or fixed or a separate binder material may be employed to bond material particles to one another and to those of a previously formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size, whereas when a liquid is employed, surface resolution is highly dependent upon the minimum surface area of the liquid which may be fixed and the minimum thickness of a layer which may be generated. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files. Thus, either male or female forms on which mold material might be disposed might be rapidly generated. Prototypes of objects might be built to verify the accuracy of the CAD file defining the object and to detect any design deficiencies and possible fabrication problems before a design was committed to large-scale production.

In more recent years, stereolithography has been employed to develop and refine object designs in relatively inexpensive materials, and has also been used to fabricate small quantities of objects where the cost of conventional fabrication techniques is prohibitive for same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which may not be fabricated satisfactorily using conventional manufacturing techniques. It has also been recognized in some industries that a stereolithographic object or component may be formed or built around another, pre-existing object or component to create a larger product.

However, to the inventors' knowledge, stereolithography has yet to be applied to mass production of articles in volumes of thousands or millions, or employed to produce, augment or enhance products including other pre-existing components in large quantities, where minute component sizes are involved, and where extremely high resolution and a high degree of reproducibility of results are required. Furthermore, conventional stereolithography apparatus and methods fail to address the difficulties of precisely locating and orienting a number of pre-existing components for stereolithographic application of material thereto without the use of mechanical alignment techniques or to otherwise assure precise, repeatable placement of components. In particular, stereolithography has not been employed to fabricate interposers for aligning and connecting a semiconductor device to a test substrate.

SUMMARY OF THE INVENTION

The present invention includes an interposer for aligning and connecting a semiconductor device to a test substrate, as well as methods for making the interposer.

The interposer of the present invention includes a semiconductor (e.g., silicon or ceramic) substrate having contact pads on a top side thereof and arranged correspondingly to conductive structures, such as solder bumps, protruding from a semiconductor device to be tested. A conductive via connects each contact pad on the top side of the interposer to a conductive element, such as a contact pad on the bottom side thereof or an electrically conductive pin, to facilitate connection with a tester. Electrical traces may reroute the positions of one or more of the contact pads from the top side to the bottom side of the interposer. The contact pads on the bottom side of the interposer are arranged correspondingly to test pads or test sockets of a test substrate with which the interposer is to be used. Conductive structures protrude from the contact pads on the bottom side of the interposer to facilitate electrical communication between the contact pads on the bottom of the interposer and their corresponding test pads or sockets.

The interposer also includes a fence, or alignment structure, disposed on the top thereof. The fence has a raised periphery, which defines a receptacle configured to receive a semiconductor device to be tested. The material of the fence may also be extended to substantially cover the top surface of the interposer and have apertures through which the contact pads on top of the interposer are exposed. The raised periphery of the fence and any apertures therethrough are configured to align a semiconductor device to be tested and the conductive structures protruding therefrom with the interposer.

According to another aspect of the present invention, the contact pads exposed to the top surface of the interposer may be recessed so as to receive conductive structures protruding from a semiconductor device to be assembled therewith. The recesses through which the contact pads are exposed may be shaped so as to facilitate an adequate electrical connection between the conductive structures of a semiconductor device to be tested and the contact pads on the top of the interposer. In one embodiment, the recesses have square shapes.

Such recesses may also have metallized, knife-edged spines protruding thereinto. The metal layer on the spines is continuous with and communicates with the contact pad exposed through the recess. As a conductive structure is disposed into each of the recesses, the spines pierce the surface of the conductive structure to ensure that an adequate electrical connection is established between the conductive structure and the corresponding contact pad despite the pressure of oxides or contaminants on the exterior of the conductive structure.

In another aspect, the raised periphery of the fence of the present invention includes laterally recessed regions that are facing, but spaced apart from, a semiconductor device when disposed in the receptacle. These laterally recessed regions facilitate some movement of a semiconductor device within the receptacle. Thus, a fence including such lateral recesses may be said to roughly align a semiconductor device disposed in the receptacle thereof, rather than precisely aligning the semiconductor device. When a semiconductor device is inserted into the receptacle of a fence having lateral recesses in the raised periphery thereof, fine alignment occurs as the conductive structures of the semiconductor device are received within apertures of the fence or recesses through which the contact pads on the top of the interposer are exposed.

The fence of the present invention may also be extended around one or more of the edges of the substrate of the interposer, as well as over at least a portion of the bottom side thereof. If the fence material covers all or a part of the bottom side of the semiconductor substrate of the interposer, contact pads on the bottom of the substrate and the conductive structures protruding therefrom are exposed through the fence, with the conductive structure preferably protruding from a bottom surface of the fence.

A method for fabricating the fence of the present invention is also within the scope of the present invention. The method may employ computer-controlled, 3-D CAD initiated, stereolithographic techniques to form the interposer fence and structures thereof either directly on or separately from the substrate of the interposer. At least the top portions of the fence may be fabricated on an interposer substrate. Alternatively, a plurality of fences may be substantially simultaneously fabricated over a large number of interposer substrate locations on a semiconductor wafer or other large-scale semiconductor substrate or on singulated substrates that are grouped together.

In stereolithographic processes, precise mechanical alignment of singulated interposers or larger substrates having multiple interposer locations is not required to practice the method of the present invention when machine vision is used to locate single substrates and features or other components thereon or associated therewith (such as bond pads, vias, solder bumps, etc.) or features on a larger substrate for alignment and material disposition purposes.

In a preferred embodiment of the invention, the interposer structure is fabricated using precisely focused electromagnetic radiation in the form of an ultraviolet (UV) wavelength laser under control of a computer and responsive to input from a machine vision system such as a pattern recognition system to fix or cure a liquid material in the form of a photopolymer.

If it is desired that a portion of the fence cover all or part of the bottom of the interposer substrate, the substrate may be flipped over and the stereolithographic process used to fabricate the bottom portion of the fence.

Alternatively, the fence may be fabricated by molding a dielectric material (e.g., a thermoplastic material) onto the substrate. Combinations of fabrication processes may also be used to form different parts of the fence.

All or part of the fence may be fabricated separately from the interposer substrate and assembled therewith, or all or part of the fence may be fabricated directly on the interposer substrate.

Other features and advantages of the present invention will become apparent to those of skill in the art through consideration of the ensuing description, the accompanying drawings, and the appended claims.

DETAILED DESCRIPTION OF THE INVENTION

The Interposer

Figure 1:
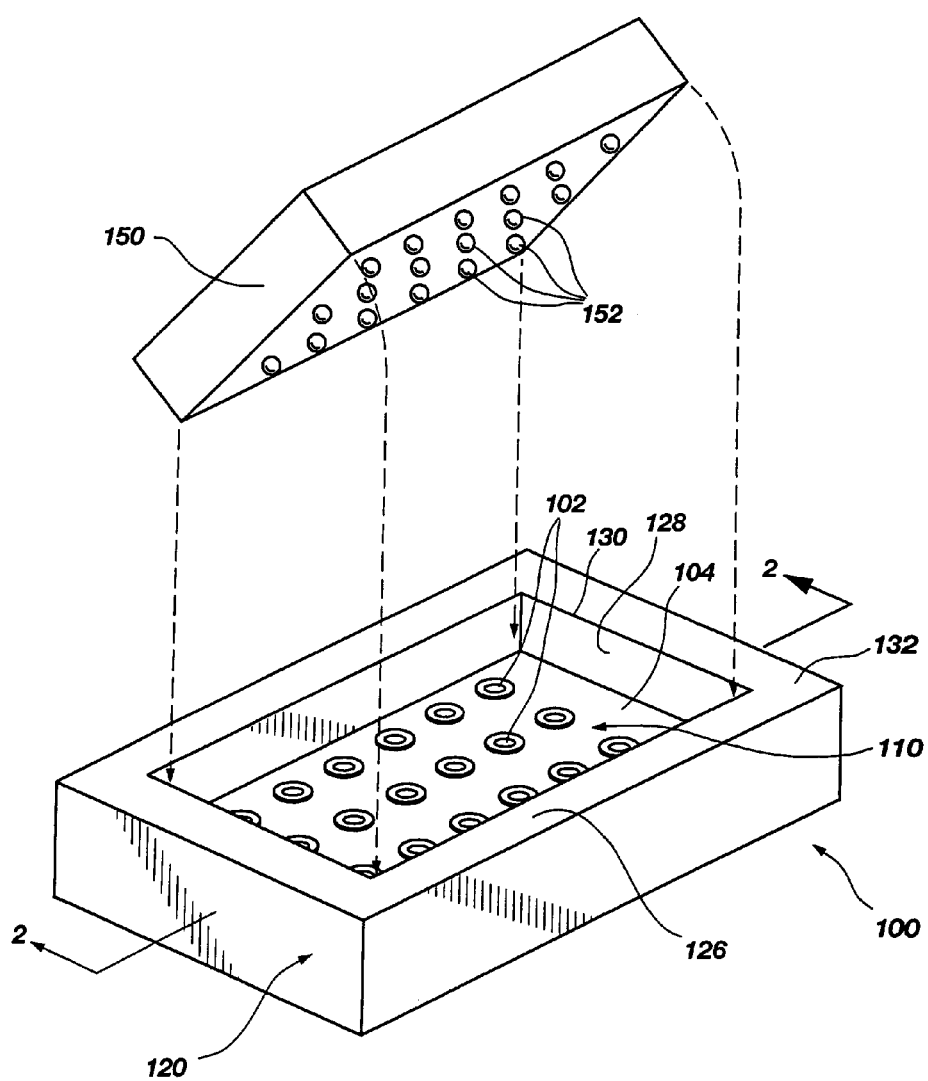
FIG. 1 is a perspective view assembly of a semiconductor device and a first embodiment of an interposer having a fence configured to receive the semiconductor device and align same with an interposer substrate.
Figure 1A:
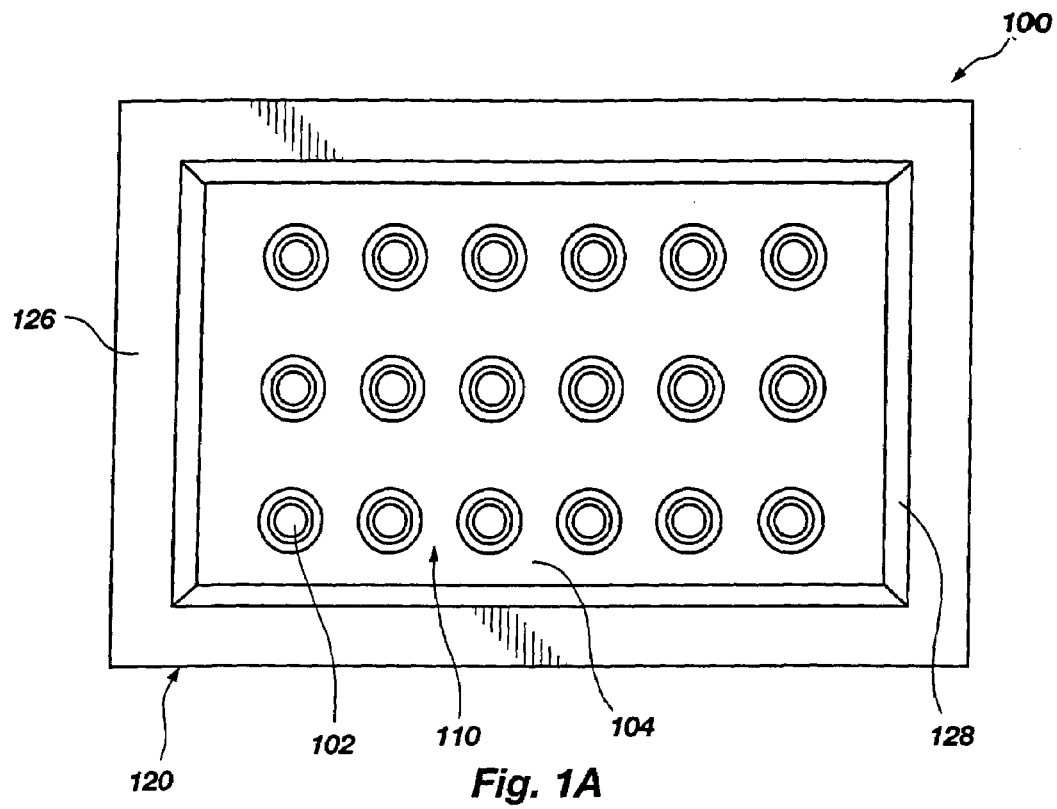
FIG. 1A is a top view of the fence and interposer of FIG. 1.
Figure 1B:
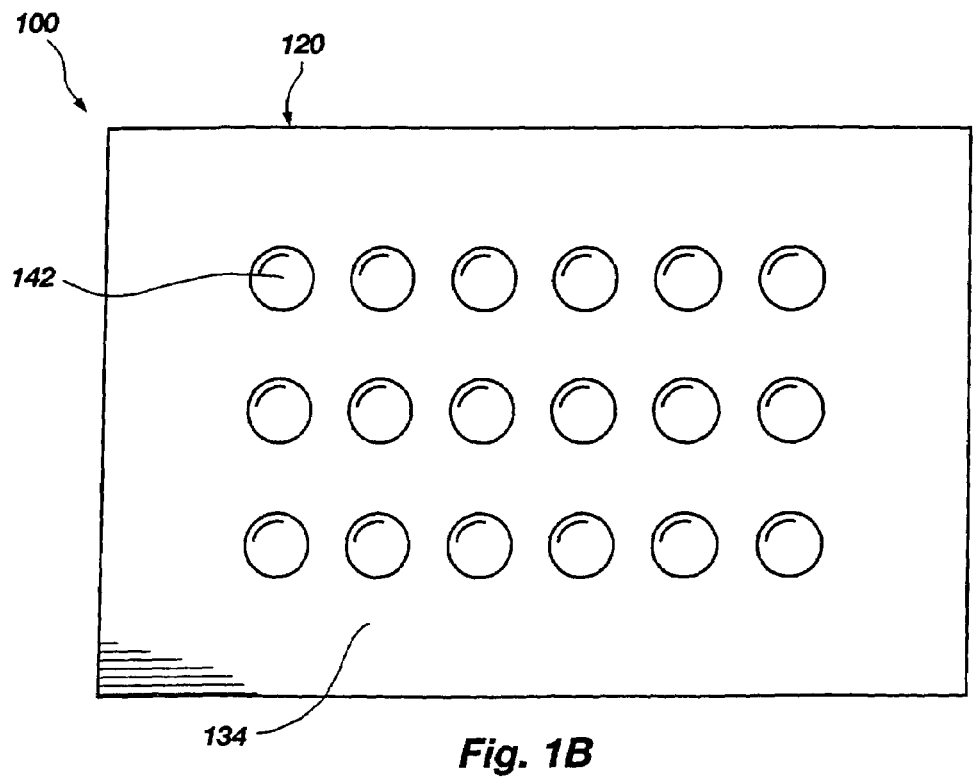
FIG. 1B is a bottom view of the fence and interposer of FIG. 1.
Figure 2:
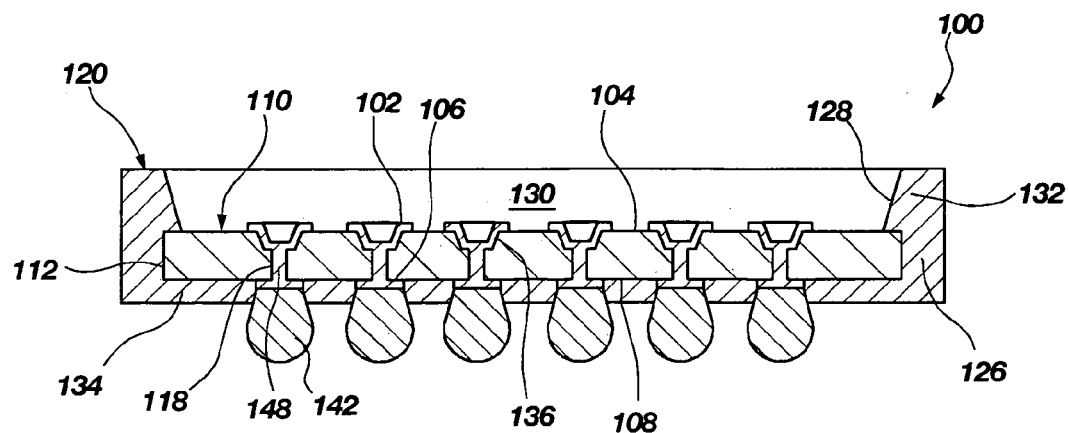
FIG. 2 is a cross-section taken along line 2—2 of FIG. 1.

FIGS. 1, 1A, 1B, and 2 depict an exemplary interposer 100 of the present invention. Interposer 100 includes an interposer substrate 110 with contact pads 102 on a top surface 104 thereof and contact pads 106 on a bottom surface 108 thereof. Contact pads 102 may be recessed relative to top surface 104, as illustrated in FIG. 2. Contact pads 102 on top surface 104 of interposer substrate 110 communicate with corresponding contact pads 106 on bottom surface 108 by way of vias 118 filled or lined with metal 148 or another conductive material. Conductive structures 142, such as balls, bumps, or conductive pillars, of a conductive material, such as a solder, a metal, a metal alloy, a conductor-filled epoxy, a conductive epoxy, or a conductive (e.g., z-axis) elastomer, are secured to and protrude from contact pads 106 and from interposer 100.

Interposer substrate 110 may be fabricated from any suitable material for use in semiconductor device applications, such as a semiconductor material (e.g., silicon, gallium arsenide, indium phosphide), ceramics, polymers, or other materials that are used as substrates in fabricating semiconductor devices and carrier substrates.

Interposer 100 also includes a fence 120 disposed on top surface 104 of interposer substrate 110. A periphery 126 of fence 120 is raised relative to top surface 104. Interior side walls 128 of raised periphery 126 form a receptacle 130, which is configured to receive a semiconductor device 150 to be tested. Preferably, receptacle 130 is also configured to align a semiconductor device 150 disposed face-down therein with interposer substrate 110, conductive structures 152 protruding from semiconductor device 150 being aligned with corresponding contact pads 102 on top surface 104 of interposer substrate 110. Interior side walls 128 may taper inward toward top surface 104 so as to facilitate the insertion of an off-center semiconductor device 150 into receptacle 130 and the alignment of such an off-center semiconductor device 150 with top surface 104.

Figure 3:
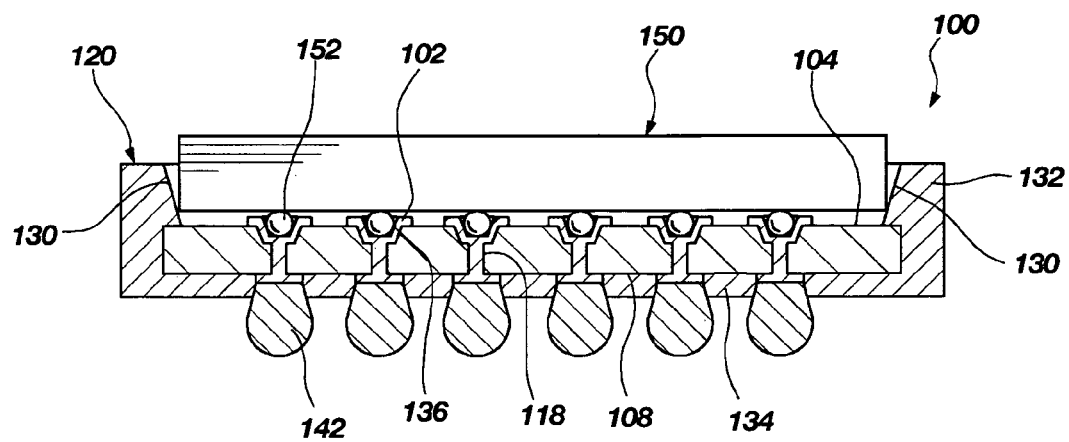
FIG. 3 is a cross-section taken along line 2—2 of FIG. 1, depicting a semiconductor device inserted in a receptacle formed by the fence.

Referring now to FIGS. 1 and 3, a semiconductor device 150 is positioned face-down over interposer 100 and inserted into receptacle 130. Upon insertion of semiconductor device 150 into receptacle 130, conductive structures 152 (e.g., solder bumps) protruding from semiconductor device 150 are received by recesses 136, which align and facilitate contact of conductive structures 152 with their corresponding contact pads 102 on top surface 104 of interposer substrate 110. This accurate alignment, facilitated by fence 120, reduces damage to conductive structures 152 during testing, as well as contains and protects semiconductor device 150 from inadvertent damage during testing thereof.

As shown in FIG. 2, fence 120 may also cover one or more of the peripheral edges 112 of interposer substrate 110, as well as all or a portion of bottom surface 108 thereof. Portions of fence 120 that cover the peripheral edges 112 of interposer substrate 110 are referred to herein as side walls 132, while portions of fence 120 that cover bottom surface 108 are collectively referred to as bottom protective layer 134.

Fence 120 may be fabricated from conventional semiconductor device packaging materials, such as resins, thermoplastic materials, or other polymers, but is preferably fabricated from a photocurable polymer, which is also referred to herein as a "photopolymer."

Figure 6:
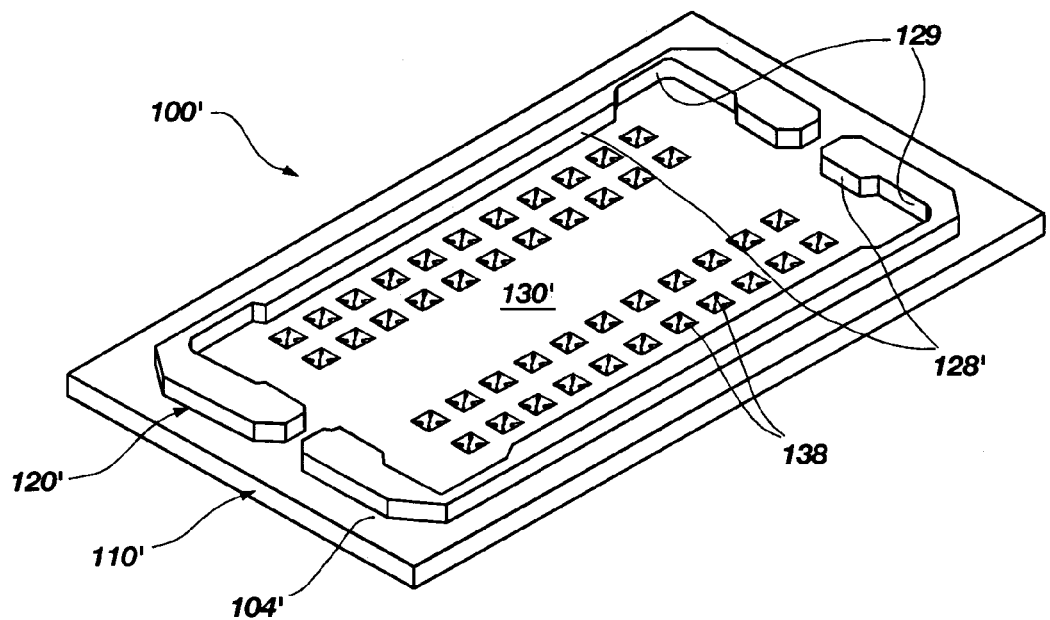
FIG. 6 is a perspective view of a second embodiment of an interposer configured to align and connect a semiconductor device to a test substrate.

Referring now to FIG. 6, another embodiment of interposer 100' has a fence 120' with laterally recessed regions 129 in sidewall 128' thereof. These laterally recessed regions 129 allow for greater tolerances in the dimensions of a semiconductor device 150 to be inserted into receptacle 130' and, therefore, only roughly align semiconductor device 150 relative to interposer substrate 110'. Fence 120' of interposer 100' also lacks a protective layer over interposer substrate 110'.

Figure 6A:
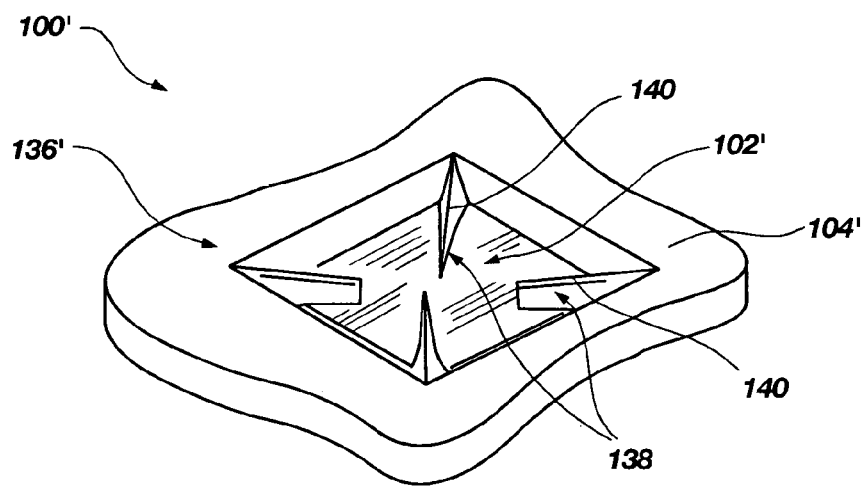
FIG. 6A is a close-up view of a recess of the interposer of FIG. 6.

FIG. 6A also depicts interposer 100' as having contact pads 102' that are exposed to top surface 104' of interposer substrate 110' through recesses 136' in top surface 104'. Knife-edged spines 138 having metallization 140 thereon protrude toward the center of each recess 136'. Spines 138 are configured to pierce a conductive structure 152 of semiconductor device 150 as conductive structure 152 is aligned with and inserted into recess 136' to communicate with contact pad 102' exposed therethrough. As metallization 140 on spines 138 is continuous with and communicates with the contact pad 102' exposed through recess 136', when a conductive structure 152 is pierced by one or more spines 138, metallization 140 ensures that conductive structure 152 will communicate with the corresponding contact pad 102'.

Figure 7:
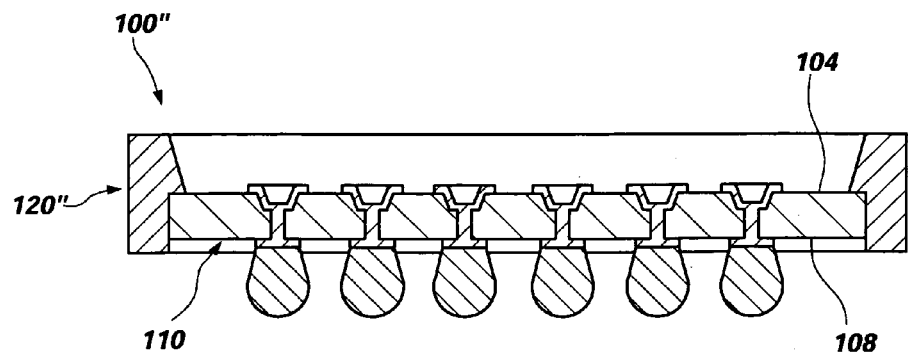
FIG. 7 is a cross-sectional view of a third embodiment of an interposer incorporating teachings of the present invention.

FIG. 7 depicts an interposer 100" having a fence 120" that lacks protective layers over both top surface 104 and bottom surface 108 of interposer substrate 110.

Figure 8:
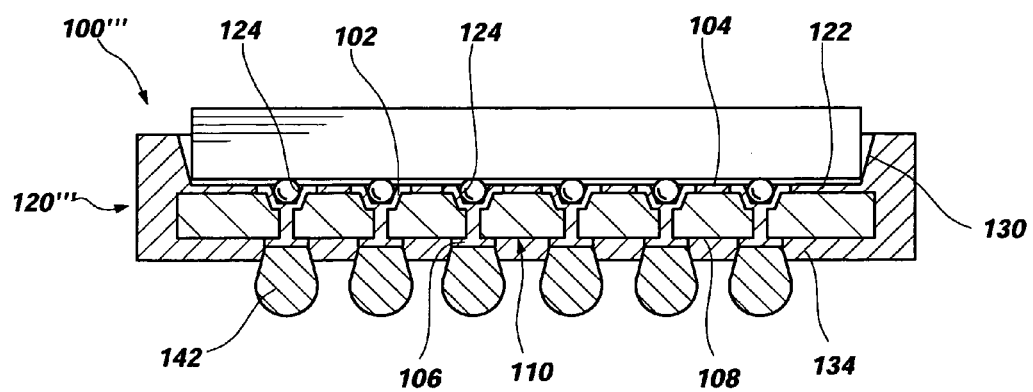
FIG. 8 is a cross-sectional view of a fourth embodiment of an interposer incorporating teachings of the present invention.

Yet another embodiment of an interposer 100''' incorporating teachings of the present invention is illustrated in FIG. 8. Interposer 100''' includes a fence 120''' having an upper protective layer 122 covering top surface 104 of interposer substrate 110 and located at the bottom of receptacle 130. Contact pads 102 of interposer substrate 110 are exposed through recesses 124 formed through layer 122. Fence 120''' also has a lower protective layer 134 covering bottom surface 108 of interposer substrate 110, through which conductive structures 142 secured to contact pads 106 extend.

Method of Fabricating the Interposer Substrate

Figure 4:
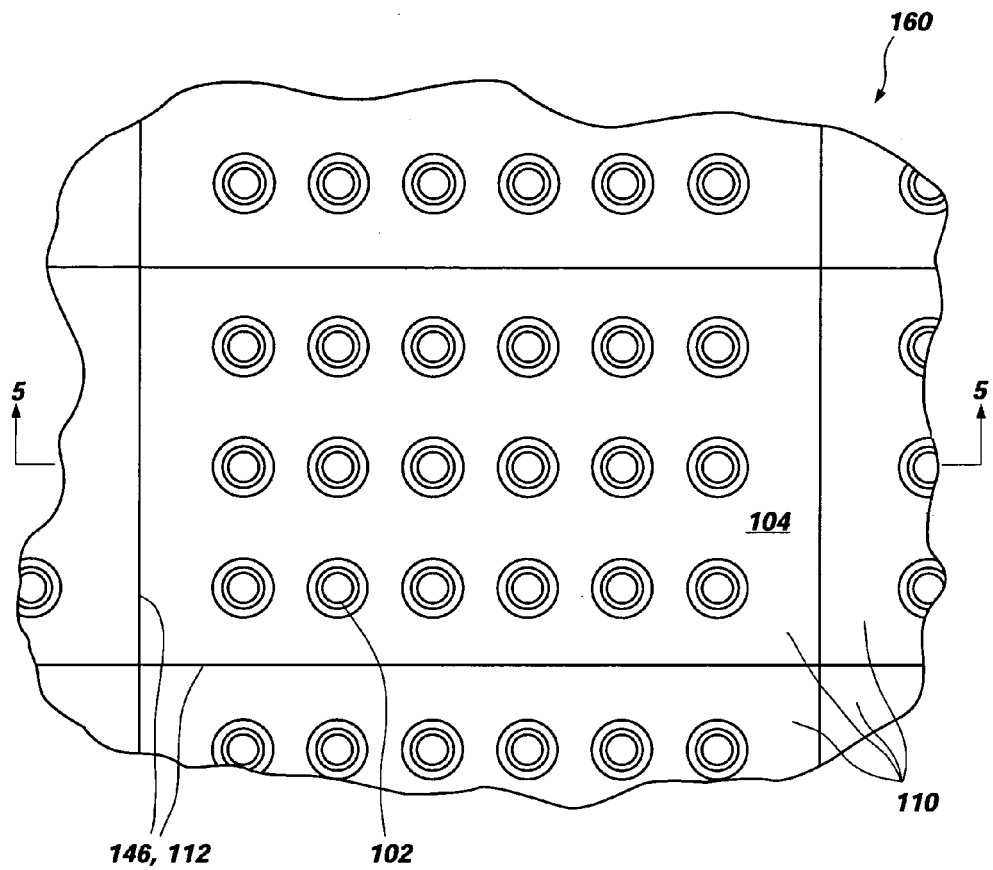
FIG. 4 is a top view of a portion of a wafer with a plurality of unsingulated interposer substrates, depicting the conductive structures thereof, including contact pads, metallized recesses, and vias.
Figure 5:
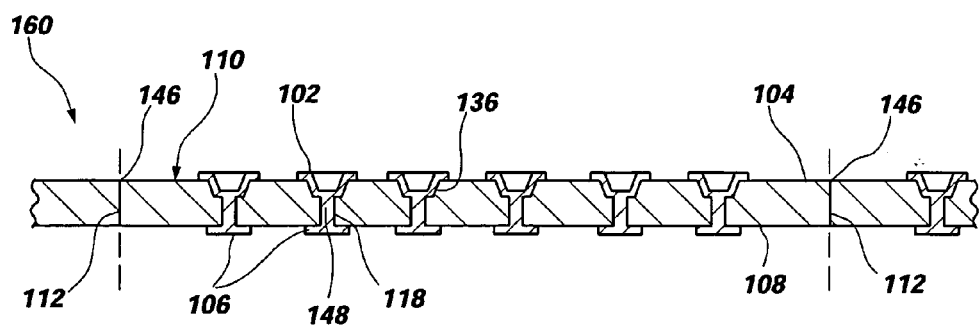
FIG. 5 is a cross-section taken along line 5—5 of FIG. 4.

As noted previously, interposer substrate 110 can be a silicon substrate. When silicon or another semiconductor, ceramic, a polymer, or another appropriate electrically nonconductive material is used as interposer substrate 110, several interposers can be simultaneously fabricated on a larger substrate, such as a silicon wafer 160 as depicted in FIGS. 4 and 5 or a large, thin structure of another appropriate material. Once interposer substrates 110 have been fabricated on wafer 160, individual interposer substrates 110 can be singulated, or diced, from wafer 160 along scribe lines 146, which define the peripheral edges 112 of the individual interposer substrates 110. As illustrated, each interposer substrate 110 is slightly larger than a semiconductor device 150 (see, e.g., FIG. 1) to be assembled therewith for testing.

With continued reference to FIGS. 4 and 5, top surface 104 of each interposer substrate 110 includes recesses 136. Recesses 136 are preferably arranged on top surface 104 in a mirror image to the arrangement of conductive structures 152 (see, e.g., FIG. 1) protruding from a semiconductor device 150 to be assembled with interposer 100. Each recess 136 is continuous with a via 118 that extends to bottom surface 108 of interposer substrate 110. Recesses 136 and vias 118 can be fabricated by any suitable semiconductor device fabrication techniques, such as the use of a photomask and etchants.

Known metallization techniques, such as chemical vapor deposition (CVD), physical vapor deposition (PVD) (e.g., sputtering), or the use of solders or molten metals, can be employed to fabricate electrically conductive structures in recesses 136 and vias 118. Preferably, each recess 136 has a contact pad 102 exposed therein. While contact pads 102 are illustrated as being recessed relative to top surface 104, contact pads 102 can be substantially flush with top surface 104 or raised relative thereto.

Contact pads 102 exposed at top surface 104 communicate with contact pads 106 at bottom surface 108 of interposer substrate 110 by way of metal or other conductive material 148 disposed in vias 118. Conductive structures 142 (FIGS. 2 and 3), such as solder bumps, or bumps, balls, or pillars of any suitable conductive material, are secured to and protrude from contact pads 106 so as to facilitate communication between a semiconductor device 150 to be assembled with interposer 110 adjacent to top surface 104 and a test substrate to be assembled with interposer 110 adjacent to bottom surface 108. Alternatively, conductive structures 142 may be bonded to a test apparatus, such as a burn-in board. As another alternative, interposer 100 could be used to electrically connect a semiconductor device 150 to any type of substrate. Other techniques may be employed to connect the interposer to test equipment, if desired.

Although conductive structures 142 are illustrated in FIGS. 2 and 3 as solder bumps, various solders and solder combinations (e.g., standard low temperature 63/37 lead/tin (Pb/Sn) solder 63% lead, 37% tin, each by weight), metals, metal alloys, conductive epoxies, and Z-axis elastomers, and other known conductive materials could also be used to form conductive structures 142 configured as bumps, balls, pillars, or films with conductive regions extending transverse to the plane of the film with insulative regions laterally therebetween so that conductive paths are established wherever the conductors are aligned with and contact electrical traces or pads above and below without lateral electrical shorting.

Methods of Fabricating the Fence

Once interposer substrate 110 has been fabricated, a fence 120 can be secured thereto. Exemplary methods that can be used to fabricate fence 120 include transfer molding and stereolithography. Fence 120 can be fabricated separately from interposer substrate 110 in one or more pieces, then secured thereto. Alternatively, all or part of fence 120 can be fabricated directly on interposer substrate 110. As another alternative, part of fence 120 can be fabricated on interposer substrate 110 while another part of fence 120 is fabricated separately from interposer substrate 110 and subsequently secured thereto.

Stereolithographic Method of Fabricating the Fence

Figure 9:
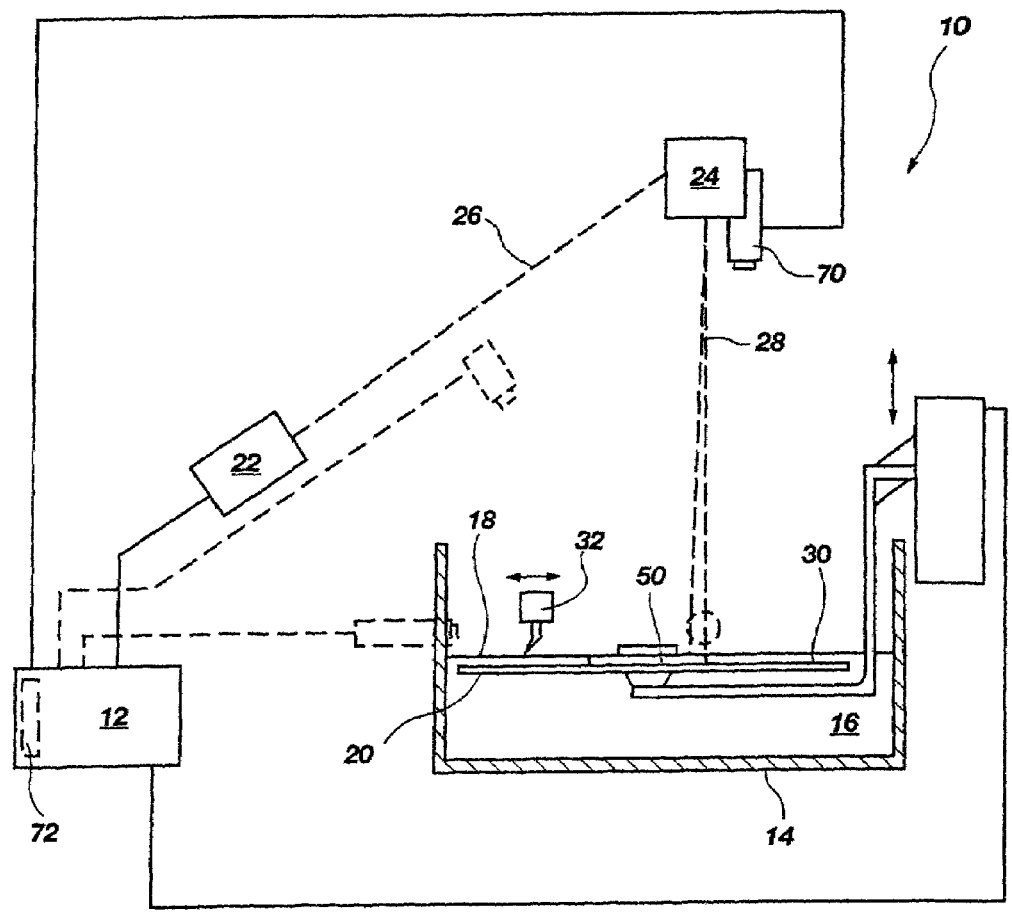
FIG. 9 is a schematic representation of an exemplary stereolithography apparatus suitable for use in practicing the method of the present invention.

FIG. 9 depicts schematically various components, and operation, of an exemplary stereolithography apparatus 10 to facilitate the reader's understanding of the technology employed in implementation of the present invention, although those of ordinary skill in the art will understand and appreciate that apparatus of other designs and manufacture may be employed in practicing the method of the present invention. The preferred, basic stereolithography apparatus for implementation of the present invention as well as operation of such apparatus are described in great detail in United States Patents assigned to 3D Systems, Inc. of Valencia, Calif., such patents including, without limitation, U.S. Pat. Nos. 4,575,330; 4,929,402; 4,996,010; 4,999,143; 5,015,424; 5,058,988; 5,059,021; 5,059,359; 5,071,337; 5,076,974; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,850,239; 5,854,748; 5,855,718; 5,855,836; 5,885,511; 5,897,825; 5,902,537; 5,902,538; 5,904,889; 5,943,235; and 5,945,058. The disclosure of each of the foregoing patents is hereby incorporated herein by this reference. As noted in more detail below, however, a significant modification is made to conventional stereolithographic apparatus, such as those offered by 3D Systems, Inc., in the context of initiation and control of the stereolithographic disposition and fixation of materials. Specifically, the apparatus of the present invention employs a so-called "machine vision" system in combination with suitable programming of the computer controlling the stereolithographic process to eliminate the need for accurate positioning or mechanical alignment of workpieces to which material is stereolithographically applied, and expands the use of conventional stereolithographic apparatus and methods to application of materials to large numbers of workpieces which may differ in orientation, size, thickness, and surface topography. The workpieces employed in the practice of the preferred embodiment of the method of the invention are substrates for forming interposers 100 wherein adaptability for rapidly fabricating large numbers of parts having the aforementioned variations in orientation, size, thickness and surface topography is very important.

With reference again to FIG. 9 and as noted above, a 3-D CAD drawing of an object to be fabricated in the form of a data file is placed in the memory of a computer 12 controlling the operation of apparatus 10 if computer 12 is not a CAD computer in which the original object design is effected. In other words, an object design may be effected in a first computer in an engineering or research facility and the data files transferred via wide or local area network, tape, disc, CD-ROM or otherwise as known in the art to computer 12 of apparatus 10 for object fabrication.

The data is preferably formatted in an STL (for STereoLithography) file, STL being a standardized format employed by a majority of manufacturers of stereolithography equipment. Fortunately, the format has been adopted for use in many solid-modeling CAD programs, so often translation from another internal geometric database format is unnecessary. In an STL file, the boundary surfaces of an object are defined as a mesh of interconnected triangles.

Apparatus 10 also includes a reservoir 14 (which may comprise a removable reservoir interchangeable with others containing different materials) of liquid material 16 to be employed in fabricating the intended object. In the currently preferred embodiment, the liquid is a photocurable polymer responsive to light in the UV wavelength range. The surface level 18 of the liquid material 16 is automatically maintained at an extremely precise, constant magnitude by devices known in the art responsive to output of sensors within apparatus 10 and preferably under control of computer 12. U.S. Pat. No. 5,174,931, referenced above and previously incorporated herein by reference, discloses one suitable level control system. A support platform or elevator 20, precisely vertically movable in fine, repeatable increments responsive to control of computer 12, is located for movement downward into and upward out of liquid material 16 in reservoir 14. A laser 22 for generating a beam of light 26 in the UV wavelength range has associated therewith appropriate optics and scan controller 24 to shape and define beam 26 into beam 28, which is directed downwardly to the surface 30 of platform 20 and traversed in the X-Y plane, that is to say, in a plane parallel to surface 30, in a selected pattern under control of computer 12 to at least partially cure liquid material 16 disposed over surface 30 to at least a semisolid, or partially consolidated, state.

Data from the STL files resident in computer 12 is manipulated to build an object 50 one layer at a time. Accordingly, the data mathematically representing object 50 is divided into subsets, each subset representing a slice or layer of object 50. This is effected by mathematically sectioning the 3-D CAD model into a plurality of horizontal layers, a "stack" of such layers representing object 50. Each slice or layer may be from about 0.0025 to 0.0300 inch thick. As mentioned previously, a thinner slice promotes higher resolution by enabling better reproduction of fine vertical surface features of object 50. In some instances, a base support or supports for an object 50 may also be programmed as a separate STL file, such supports being fabricated before the overlying object 50 in the same manner and facilitating fabrication of an object 50 with reference to a perfectly horizontal plane and removal of object 50 from surface 30 of elevator 20. Where a "recoater" blade 32 is employed as described below, the interposition of the base supports precludes inadvertent contact of blade 32 with surface 30.

Before fabrication of object 50 is initiated with apparatus 10, the primary STL file for object 50 and the file for the base support(s) are merged. It should be recognized that, while reference has been made to a single object 50, multiple objects may be concurrently fabricated on surface 30 of platform 20. In such an instance, the STL files for the various objects and supports, if any, are merged. Operational parameters for apparatus 10 are then set, for example, to adjust the size (diameter, if circular) of the laser light beam used to cure material 16.

Before initiation of a first layer for a support or object 50 is commenced, computer 12 automatically checks and, if necessary, adjusts by means known in the art, as referenced above, the surface level 18 of liquid material 16 in reservoir 14 to maintain same at an appropriate focal length for laser beam 28. Alternatively, the height of scan controller 24 may be adjusted responsive to a detected surface level 18 to cause the focal point of laser beam 28 to be located precisely at the surface of liquid material 16 at surface level 18 if level 18 is permitted to vary. The platform 20 may then be submerged in liquid material 16 in reservoir 14 to a depth greater than the thickness of one layer or slice 60 of the object 50 (FIG. 10(F)), then raised to a depth equal to the thickness of a layer 60, and the liquid surface level 18 readjusted as required to accommodate liquid material 16 displaced by submergence of platform 20 while the surface of the material 16 in reservoir 14 settles to be free of ripples and other surface discontinuities which might result in an uneven layer when material 16 is subjected to laser beam 28. Laser 22 is then activated so that laser beam 28 will scan liquid material 16 over surface 30 of platform 20 to at least partially cure (e.g., at least partially polymerize) liquid material 16 at selected locations, defining the boundaries of a first layer 60 (of object 50 or a support therefor, as the case may be) and filling in solid portions thereof. Platform 20 is then lowered by a distance greater than the thickness of a layer 60, raised to a depth equal to the thickness thereof, and the laser beam 28 scanned again to define and fill in the second layer 60 while simultaneously bonding the second layer to the first. The process is then repeated, layer by layer, until object 50 is completed.

If a recoater blade 32 is employed, the process sequence is somewhat different. In this instance, surface 30 of platform 20 is lowered into liquid material 16 below surface level 18 a distance greater than a thickness of a single layer of material 16 to be cured, then raised thereabove until it is precisely one layer's thickness below blade 32. Blade 32 then sweeps horizontally over surface 30, or (to save time) at least over a portion thereof on which object 50 is to be fabricated, to remove excess liquid material 16 and leave a film thereof of the precise, desired thickness on surface 30. Platform 20 is then lowered so that the surface of the film and material level 18 are coplanar and the surface of the material 16 is still. Laser 22 is then initiated to scan with laser beam 28 and define the first layer 60. The process is repeated, layer by layer, to define each succeeding layer 60 and simultaneously bond same to the next lower layer 60 until object 50 is completed. A more detailed discussion of this sequence and apparatus for performing same is disclosed in U.S. Pat. No. 5,174,931, previously incorporated herein by reference.

Each layer 60 of object 50 is preferably built by first defining any internal and external object boundaries of that layer 60 with laser beam 28, then hatching solid areas of object 50 with laser beam 28. The internal and external object boundaries of all layers 60 comprise an envelope 80 whose boundaries are set by the software (see FIGS. 10(B)–10(E)). If a particular part of a particular layer 60 is to form a boundary of a void in the object a)bove or below that layer 60, then the laser beam 28 is scanned in a series of closely spaced, parallel vectors so as to develop a continuous surface, or skin, with improved strength and resolution. The time it takes to form each layer 60 depends upon its geometry, surface tension and viscosity of material 16, and thickness of the layer.

Once object 50 is completed, platform 20 is elevated above surface level 18 of liquid material 16, and the platform 20 with object 50 may be removed from apparatus 10. Excess, uncured liquid material 16 on the surface of object 50 may be manually removed, and object 50 then solvent-cleaned and removed from platform 20, usually by cutting it free of any base supports. Object 50 may then require postcuring, as material 16 may be only partially polymerized and exhibit only a portion (typically 40% to 60%) of its fully cured strength. Postcuring to completely harden object 50 may be effected in another apparatus projecting UV radiation in a continuous manner over object 50 and/or by thermal completion of the initial, UV-initiated partial cure.

In practicing the present invention, a commercially available stereolithography apparatus operating generally in the manner as that described with respect to apparatus 10 of FIG. 9 is preferably employed. For example and not by way of limitation, the SLA-250/50HR, SLA-5000 and SLA-7000 stereolithography systems, each offered by 3D Systems, Inc. of Valencia, Calif., are suitable for modification. Photopolymers believed to be suitable for use in practicing the present invention include Cibatool SL 5170 and SL 5210 resins for the SLA-250/50HR system, Cibatool SL 5530 resin for the SLA-5000 and Cibatool SL 7510 resin for the SLA-7000 system. All of these resins are available from Ciba Specialty Chemicals Inc. By way of example and not limitation, the layer thickness of material 16 to be formed, for purposes of the invention, may be on the order of 0.001 to 0.002 inch, with a high degree of uniformity over a field on a surface 30 of a platform 20. It should be noted that different material layers may be of different heights, so as to form a structure of a precise, intended total height or to provide different material thicknesses for different portions of a structure. The size of the laser beam "spot" impinging on the surface of liquid material 16 to cure same may be on the order of 0.002 inch to 0.008 inch. Resolution is preferably ±0.0003 inch in the X-Y plane (parallel to surface 30) over at least a 0.5 inch×0.25 inch field from a center point, permitting a high resolution scan effectively across a 1.0 inch×0.5 inch area. Of course, it is desirable to have substantially this high a resolution across the entirety of surface 30 of platform 20 to be scanned by laser beam 28, which area may be termed the "field of exposure," such area being substantially coextensive with the vision field of a machine vision system employed in the apparatus of the invention as explained in more detail below. The longer and more effectively vertical the path of laser beam 26/28, the greater the achievable resolution.

Referring again to FIG. 9 of the drawings, it should be noted that apparatus 10 of the present invention includes a camera 70 which is in communication with computer 12 and preferably located, as shown, in close proximity to scan controller 24 located above surface 30 of platform 20. Camera 70 may be any one of a number of commercially available cameras, such as capacitive-coupled discharge (CCD) cameras available from a number of vendors. Suitable circuitry as required for adapting the output of camera 70 for use by computer 12 may be incorporated in a board 72 installed in computer 12, which is programmed as known in the art to respond to images generated by camera 70 and processed by board 72. Camera 70 and board 72 may together comprise a so-called "machine vision system," and specifically a "pattern recognition system" (PRS), the operation of which will be described briefly below for a better understanding of the present invention. Alternatively, a self-contained machine vision system available from a commercial vendor of such equipment may be employed. For example, and without limitation, such systems are available from Cognex Corporation of Natick, Mass. For example, the apparatus of the Cognex BGA Inspection Package™ or the SMD Placement Guidance Package™ may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated by this reference.

In order to facilitate practice of the present invention with apparatus 10, a data file representative of at least one physical parameter, such as the size, configuration, thickness and surface topography of a particular type and design of interposer substrate 110 to which fence 120 is to be secured to form an interposer 100 of the invention, is placed in the memory of computer 12. If the interposer 100 is to be formed to accept a particular type of semiconductor device 150, data representative of semiconductor device 150, including the arrangement of conductive structures 152 protruding therefrom, is provided.

Camera 70 is then activated to locate the position and orientation of each interposer substrate 110 by scanning platform 20 and comparing the features of interposer substrates 110 disposed thereon with those in the data file residing in memory, the locational and orientational data for each interposer substrate 110 then also being stored in memory. It should be noted that the data file representing the design size, shape and topography for interposer substrates 110 may be used at this juncture to detect physically defective or damaged interposer substrates 110 prior to forming a fence 120 thereon and to automatically delete such from the interposer manufacturing operation. It should also be noted that data files for more than one type (size, thickness, configuration, surface topography) of interposer substrate 110 may be placed in computer memory and computer 12 programmed to recognize not only substrate locations and orientations, but which type of interposer substrate 110 is at each location so that material 16 may be cured by laser beam 28 in the correct pattern and to the height required to define interposer sidewalls and area coverage, providing a receptacle 130 of the correct size, height and location on each interposer 100.

If structural material in the form of the aforementioned photopolymer is to be applied to top surfaces 104 (see FIG. 1) of interposer substrates 110, or to top surfaces 104 and portions or all of peripheral edges 112 of interposer substrates 110, a large plurality of such substrates 110 may be placed, bottom side 108 down, on surface 30 of platform 20 for formation of fences 120. If bottom protective layers 134 are to be fabricated on bottom surfaces 108 of interposer substrates 110, it may be desirable to first mount interposer substrates 110 upside down on platform 20 to form bottom protective layer 134, then reposition interposer substrates 110 right-side up to fabricate the remainder of fence 120.

Continuing with reference to a stereolithographic method shown in FIG. 9 of the drawings, the use of stereolithography to fabricate a bottom protective layer 134 of fence 120 on bottom surface 108 of interposer substrate 110 is illustrated. An interposer substrate 110 may be inversely mounted on platform 20 so that structure may be formed on bottom surface 108 (see FIG. 10(A)). Interposer substrate 110 may then be submerged partially below the surface level 18 of liquid material 16 to a depth greater than the thickness of a first layer 60 of material on bottom surface 108. The layer or "slice" 60 is then at least partially cured to a semisolid state to form the lowest layer of a bottom protective layer 134. Curable material overlying contact pads 106 is left uncured by not exposing those areas to radiation. If additional layers 60 are required to obtain a particular desired bottom protective layer 134, the process is repeated by further submerging interposer substrate 110 to raise the liquid level to a depth equal to the desired layer thickness, allowing the surface of liquid material 16 to settle, and selectively curing the curable material to form a bottom protective layer 134.

The material 16 selected for use in forming the interposer 100 may be a photopolymer such as one of the above-referenced resins from Ciba Specialty Chemicals Inc. which are believed to exhibit a desirable dielectric constant and low shrinkage upon cure, are of sufficient (i.e., semiconductor grade) purity, exhibit good adherence to other materials used in semiconductor devices, and have a coefficient of thermal expansion (CTE) sufficiently similar to that of the interposer substrate 110 so that the substrate and the fence 120 are not stressed during thermal cycling in testing and use. One area of particular concern in determining resin suitability is the substantial absence of mobile ions and, specifically, fluorides.

It may be desirable that surface 30 of platform 20 comprise, or be coated or covered with, a material or stereolithographically fabricated structures from which the at least partially cured material 16 defining the lowermost layers of the interposer 100 may be easily released to prevent damage to fence 120 and other parts of interposer 100 during removal of a completed interposer 100 or fence 120 from platform 20. Alternatively, a solvent may be employed to release the completed interposer 100 or fence 120 from platform 20. Such release and solvent materials are known in the art. See, for example, U.S. Pat. No. 5,447,822 referenced above and previously incorporated herein by reference.

To describe the stereolithography curing process in more detail, as depicted in FIG. 9, laser 22 is activated and scanned to direct beam 28, under control of computer 12, about the periphery or over each interposer substrate 110 to effect the aforementioned partial cure of material 16 to form a first layer 60. The platform 20 is then lowered into reservoir 14 and raised another layer thickness-equaling depth increment and laser 22 activated to add another layer 60. This sequence continues, layer 60 by layer 60, until fence 120 is built up.

Figure 10:
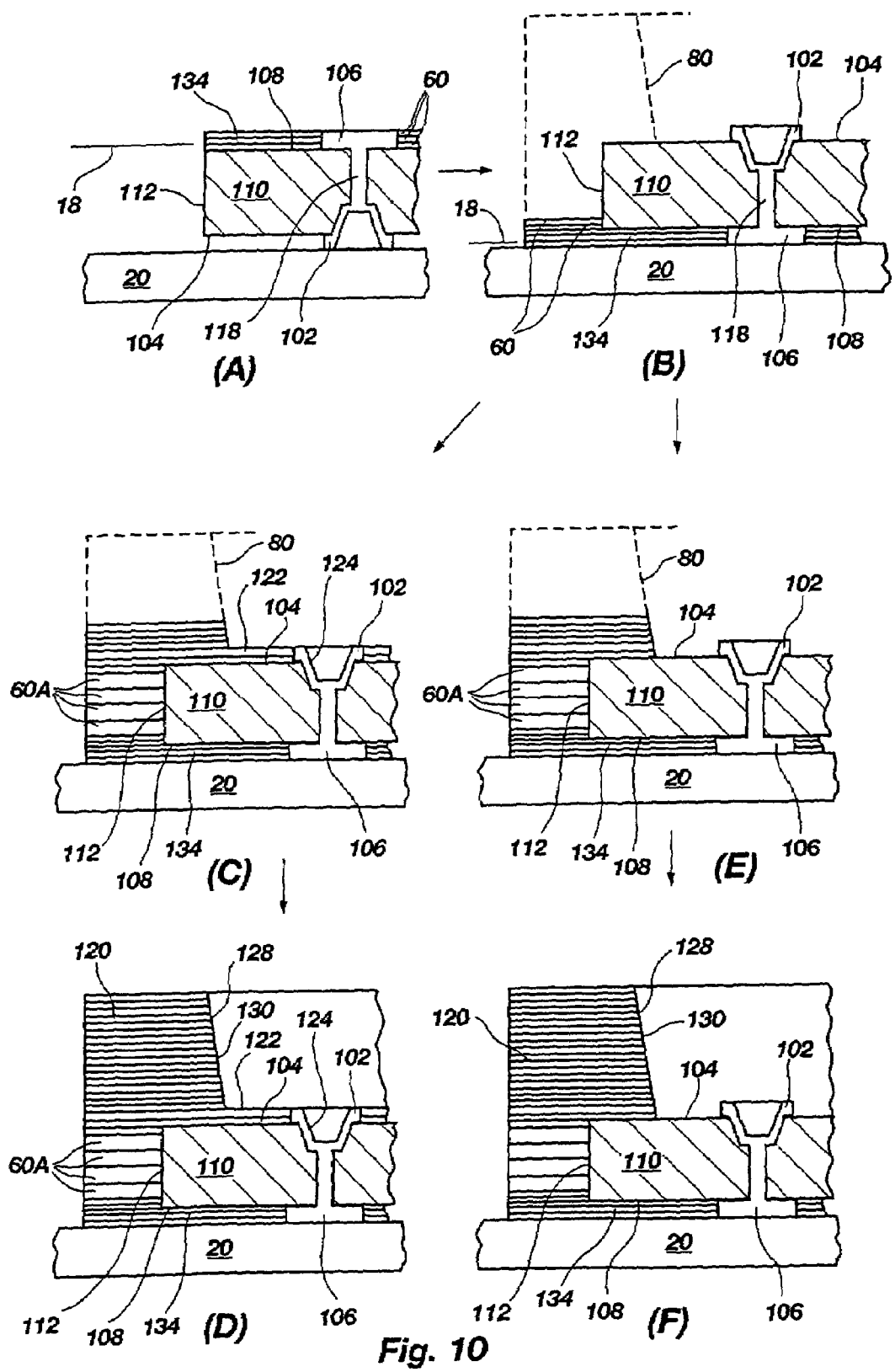
FIGS. 10(A)–(F) are stepwise partial cross-sectional depictions of the use of stereolithography to fabricate the fences of the interposers of the present invention.

As shown in FIG. 10(B), interposer substrate 110 with attached bottom protective layer 134 is inverted and remounted on the platform 20. At this point, platform 20 is again lowered to submerge a lower portion of interposer substrate 110 below surface level 18 and then positioned a desired additional depth increment below the surface of material 16. Layers 60 of at least semicured material are formed in sequence by repeating the method.

FIGS. 10(C) and 10(D) illustrate fabrication of an upper protective layer 122 over top surface 104 of interposer substrate 110. Contact pads 102 are exposed through recesses 124 formed in upper protective layer 122.

FIGS. 10(E) and 10(F) depict an alternative interposer structure without an upper protective layer 122. FIGS. 10(E) and 10(F) show interposers 100 which have fences 120 thereon that are completed except for a final cure.

The thickness of layer 60 may be preprogrammed for each layer over a relatively wide range. The greatest precision is attained by forming thin layers, while thickness may be increased to save time where extremely high precision is not necessary. Layers of greater thickness in FIGS. 10(C)–(F) are identified by the numeral 60A.

In an alternative stereolithographic method, fence 120 is fabricated by merely curing a "skin" over a surface of the structure envelope 80, the final cure of the material of fence 120 being effected subsequently by broad-source UV radiation in a chamber, or by thermal cure in an oven. In this manner, an extremely thick protective layer of material 16 may be formed in minimal time within apparatus 10.

The stereolithographic method as described enables precise positioning by machine vision of a receptacle 130 on an interposer substrate 110 irrespective of the location of interposer substrate 110 on platform 20. Thus, the use of stereolithography to fabricate fence 120 facilitates the formation of an interposer 100 having a receptacle 130 within which a semiconductor device 150 may be accurately aligned with and connected to interposer substrate 110.

It is notable that the stereolithographic method of the present invention, in addition to eliminating the capital equipment expense of transfer molding processes, is extremely frugal in its use of dielectric encapsulant material 16, since all such material in which cure is not initiated by laser 22 remains in a liquid state in reservoir 14 for use in forming fences 120 on the next plurality of interposer substrates 110. Also, surprisingly, the structure dimensional tolerances achievable through use of the present invention are more precise, e.g., three times more precise, than those of which a transfer molding system is capable, and there is no need for an inclined mold sidewall (and thus extra packaging material) to provide a release angle to facilitate removal of an interposer 100 from a mold cavity. Moreover, there is no potential for mold damage, or mold wear, or requirement for mold refurbishment. Finally, the extended cure times at elevated temperatures, on the order of, for example, four hours at 175° C., required after removal of batches of interposers 100 from the transfer mold cavities are eliminated. Post-cure of interposers 100 formed according to the present invention may be effected with broad-source UV radiation emanating from, for example, flood lights in a chamber through which interposers are moved on a conveyor, either singly or in large batches. Additionally, if some portion of an interposer 100 is shadowed by another part of itself or another interposer, curing of material 16 in that shadowed area will eventually occur due to the cross-linking initiated in the outwardly adjacent photopolymer. The curing of any uncured photopolymer, in shadowed areas or elsewhere, may be accelerated as known in the art, such as by a thermal cure (e.g., heating the polymer at a relatively low temperature such as 160° C.).

It should also be noted that the stereolithographic method of the present invention is conducted at substantially ambient temperature, the small beam spot size and rapid traverse of laser beam 28 around and over the substrates 110 resulting in negligible thermal stress thereon. Physical stress on the fence 120 is also significantly reduced, in that material 16 is fixed in place and not moved over the structure in a viscous, high-pressure wave front as in transfer molding, followed by cooling-induced stressing of the package.

Molding Method of Fabricating the Fence

Figure 11:
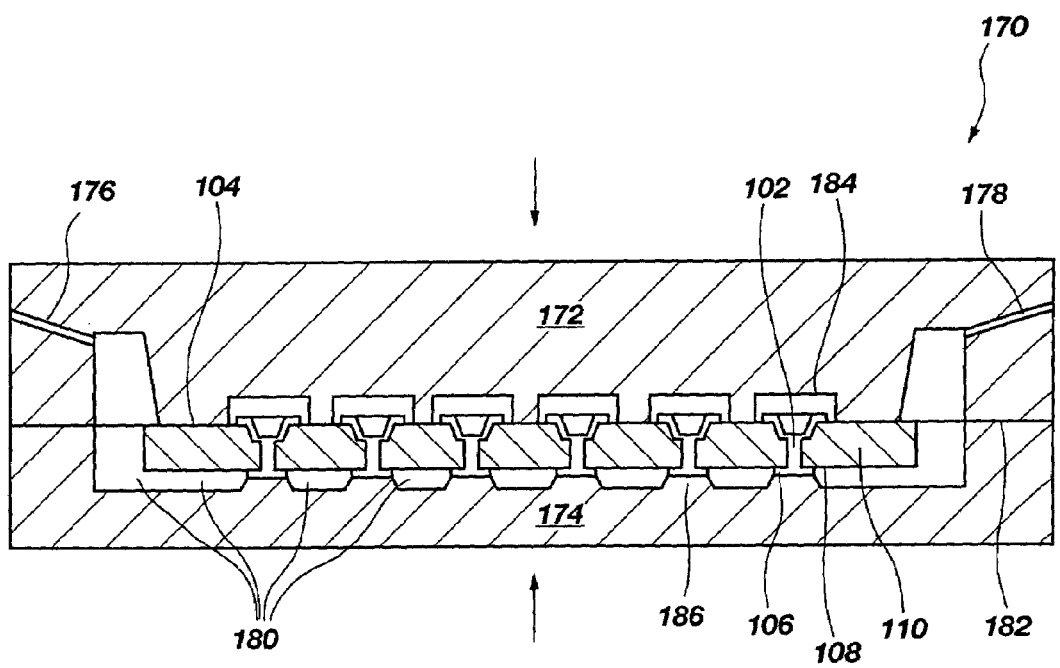
FIG. 11 is a cross-sectional side view of a mold that may be used to fabricate an interposer according to the present invention.

Although stereolithography is a preferred method for forming an interposer 100 of the invention, having many advantages described above, known molding processes may nonetheless be used to fabricate fence 120 of interposer 100. FIG. 11 schematically illustrates an exemplary mold 170 in which an interposer substrate 110 may be positioned to form a fence 120, 120', 120'', 120''' (see FIGS. 1, 1A, 2, 3, 6–8) thereon. As illustrated, mold 170 has an upper mold half 172 and a lower mold half 174. Upper mold half 172 is shown with receptacles 184 for receiving any protecting, projecting portions of contact pads 102. Lower mold half 174 is shown with upwardly extending projections 186 which form apertures through the lower protective layer of fence 120, through which contact pads 106 will be exposed. In addition, when biased against an interposer substrate 110, projections 186 prevent leakage of mold material onto contact pads 102, 106, as well as damage that may be caused to interposer substrate 110 as mold material is introduced into cavity 180.

When assembled, mold halves 172 and 174 are joined at a periphery 182 of mold 170. When mold halves 172 and 174 are so assembled, one or more cavities 180 are formed internally within mold 170. In use of mold 170, a flowable mold material, such as a thermoplastic material, is introduced into each cavity 180 through an inlet port 176. As the flowable mold material enters and fills each cavity 180, air or gas within cavity 180 is driven therefrom through vent(s)

178. As the flowable mold material is shaped by cavity 180 and begins to harden, fence 120 is formed.

Further Processing of the Interposer

Following the fabrication of fence 120 and assembly thereof with interposer substrate 110, conductive structures 142 can be secured by known processes to contact pads 106 exposed at bottom surface 108 of interposer substrate 110. Conductive structures 142 can be bumps, balls, pillars, or structures having any other suitable configuration that are fabricated from a suitable conductive material, such as solder, metal, metal alloy, conductor-filled epoxy, or conductive elastomer.

Interposers incorporating teachings of the present invention are useful for connecting semiconductor devices, including, without limitation, flip-chips, chip scale packages, and ball grid array packages, to a substrate, such as a test substrate or a higher level carrier substrate.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method for fabricating an interposer, comprising:
   providing at least one interposer; and
   fabricating at least one fence configured for placement on a surface of the at least one interposer, the at least one fence including a receptacle configured to receive at least one semiconductor device so as to align discrete conductive elements protruding therefrom with corresponding contact pads at the surface of the at least one interposer, the fabricating including:
   at least partially, selectively consolidating unconsolidated material to form a first portion of the at least one fence; and
   repeating the at least partially, selectively consolidating at least once to form at least one additional portion of the at least one fence.

2. The method of claim 1, further comprising securing other discrete conductive elements to other contact pads at an opposite surface of the at least one interposer and in communication with the contact pads at the surface of the at least one interposer.

3. The method of claim 2, wherein securing other discrete conductive elements comprises disposing solder bumps on the other contact pads.

4. The method of claim 2, wherein securing other discrete conductive elements comprises securing at least one of conductive balls, conductive bumps, conductive pillars, and Z-axis adhesive film to the other contact pads.

5. The method of claim 1, further comprising:
   placing or forming a protective layer over at least a portion of at least one surface and an opposite surface of the at least one interposer, with the contact pads of the at least one interposer being exposed through the protective layer.

6. The method of claim 1, wherein fabricating the at least one fence includes disposing a portion of the at least one fence over at least one peripheral edge of the at least one interposer.

7. The method of claim 1, wherein fabricating the at least one fence comprises fabricating at least one fence having a receptacle configured to progressively guide the at least one semiconductor device into alignment with the at least one interposer upon assembly of the at least one semiconductor device and the at least one interposer.

8. The method of claim 1, wherein fabricating the at least one fence comprises fabricating the at least one fence on the surface of the at least one interposer.

9. The method of claim 8, wherein fabricating the at least one fence comprises fabricating the at least one fence from a photopolymer.

10. The method of claim 8, wherein fabricating the at least one fence comprises molding the at least one fence onto the at least one interposer.

11. The method of claim 1, wherein fabricating comprises:
    placing the at least one interposer in a first orientation;
    determining an envelope defining limits of inner and outer surfaces of the at least one fence; and
    forming at least a portion of the at least one fence as a series of superimposed, contiguous, mutually adhered layers of material commencing at a defined limit of the at least one fence.

12. The method of claim 11, further comprising:
    inverting the at least one interposer to a second orientation; and
    forming additional portions of the at least one fence as a series of superimposed, contiguous, mutually adhered layers of material.

13. The method of claim 12, wherein forming additional portions comprises adhering the additional portions to the at least one fence.

14. The method of claim 1, wherein at least partially, selectively consolidating is effected by directing a focused beam of radiation onto a surface of selected regions of the unconsolidated material.

15. The method of claim 1, wherein the at least one fence comprises at least one prefabricated fence and further comprising securing the at least one prefabricated fence to the at least one interposer.

16. The method of claim 1, wherein fabricating the at least one fence comprises forming a plurality of superimposed, contiguous, mutually adhered layers comprising at least partially consolidated material.

17. The method of claim 1, wherein providing at least one interposer comprises providing a substrate including a plurality of smaller interposers thereon.

18. The method of claim 1, wherein providing at least one interposer comprises providing a plurality of individual interposers.

19. The method of claim 1, wherein providing at least one interposer comprises providing a single interposer.

20. A method for fabricating an interposer, comprising:
    providing at least one interposer; and
    fabricating at least one fence configured for placement on a surface of the at least one interposer, the at least one fence including a receptacle configured to receive at least one semiconductor device so as to align discrete conductive elements protruding therefrom with corresponding contact pads at the surface of the at least one interposer, fabricating including:
    placing the at least one interposer in a first orientation;
    determining an envelope defining limits of inner and outer surfaces of the at least one fence; and
    forming at least a portion of the at least one fence as a series of superimposed, contiguous, mutually adhered layers of material commencing at a defined limit of the at least one fence.

21. The method of claim 20, wherein fabricating further comprises:
inverting the at least one interposer to a second orientation; and
forming additional portions of the at least one fence as a series of superimposed, contiguous, mutually adhered layers of material.

22. The method of claim 21, wherein forming additional portions comprises adhering the additional portions to the at least one fence.

23. The method of claim 20, wherein fabricating the at least one fence includes disposing a portion of the at least one fence over at least one peripheral edge of the at least one interposer.

24. The method of claim 20, wherein fabricating the at least one fence comprises fabricating at least one fence having a receptacle configured to progressively guide the at least one semiconductor device into alignment with the at least one interposer upon assembly of the at least one semiconductor device and the at least one interposer.

25. The method of claim 20, wherein forming is effected by directing a focused beam of radiation onto a surface of selected regions of a layer.

26. A method for fabricating an interposer, comprising:
providing at least one interposer; and
fabricating at least one fence configured for placement on a surface of the at least one interposer, the at least one fence including a receptacle configured to receive at least one semiconductor device so as to align discrete conductive elements protruding therefrom with corresponding contact pads at the surface of the at least one interposer, fabricating including:
directing a focused beam of radiation onto a surface of selected regions of unconsolidated material to at least partially consolidate material in the selected regions so as to form a first portion of the at least one fence; and
repeating directing at least once to form at least one additional portion of the at least one fence.

27. The method of claim 26, wherein fabricating the at least one fence includes disposing a portion of the at least one fence over at least one peripheral edge of the at least one interposer.

28. The method of claim 26, wherein fabricating the at least one fence comprises fabricating at least one fence having a receptacle configured to progressively guide the at least one semiconductor device into alignment with the at least one interposer upon assembly of the at least one semiconductor device and the at least one interposer.

29. The method of claim 26, wherein fabricating the at least one fence comprises forming a plurality of superimposed, contiguous, mutually adhered layers comprising at least partially consolidated material.

* * * * *